United States Patent [19]
Park

[11] Patent Number: 5,771,029
[45] Date of Patent: Jun. 23, 1998

[54] SIDE PINCUSHION CONTROL APPARATUS

[75] Inventor: Won Gu Park, Kyungsangbuk-Do, Rep. of Korea

[73] Assignee: LG Electronics, Inc., Seoul, Rep. of Korea

[21] Appl. No.: 512,047

[22] Filed: Aug. 7, 1995

[30] Foreign Application Priority Data

Aug. 10, 1994 [KR] Rep. of Korea ............. 94-19738

[51] Int. Cl.[6] ............. G09G 1/06; G09G 1/04; H04N 3/223
[52] U.S. Cl. ............. 345/10; 345/13; 345/127; 348/746; 348/747; 315/370; 315/371; 315/367
[58] Field of Search ............. 345/10–15, 127; 315/370, 371, 367; 348/747, 746, 806

[56] References Cited

U.S. PATENT DOCUMENTS

| | | |
|---|---|---|
| 3,706,905 | 12/1972 | Alexander ............. 315/371 |
| 4,048,544 | 9/1977 | Haferi ............. 315/408 |
| 4,309,640 | 1/1982 | Gordon ............. 315/371 |
| 4,469,992 | 9/1984 | Favreau et al. ............. 315/371 |
| 4,490,653 | 12/1984 | Olmstead ............. 315/404 |
| 4,827,193 | 5/1989 | Watanuki et al. ............. 315/371 |
| 5,357,175 | 10/1994 | Kamada et al. ............. 315/371 |
| 5,412,290 | 5/1995 | Helfrich ............. 315/371 |
| 5,475,286 | 12/1995 | Jackson et al. ............. 315/371 |
| 5,530,488 | 6/1996 | Rilly et al. ............. 348/747 |

*Primary Examiner*—Steven Saras
*Assistant Examiner*—David L. Lewis
*Attorney, Agent, or Firm*—Fish & Richardson P.C.

[57] ABSTRACT

A side pincushion control apparatus for compensating for a horizontal picture size control voltage and a side pincushion in a monitor. The apparatus compensates for the horizontal picture size control voltage and the side pincushion of the picture using a microcomputer, so that the picture is prevented from being unstable during the side pincushion compensation.

4 Claims, 4 Drawing Sheets

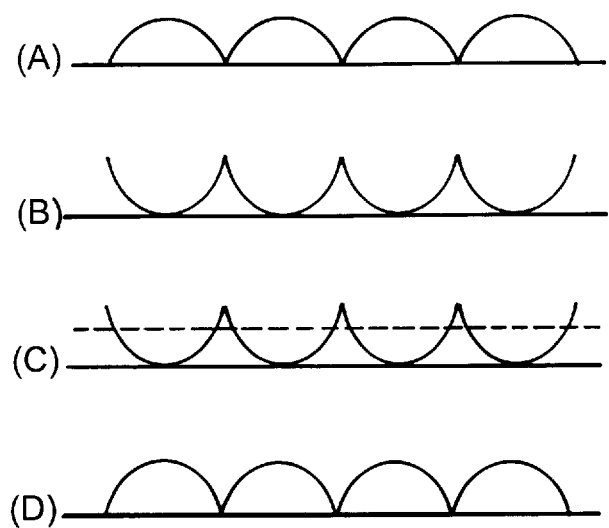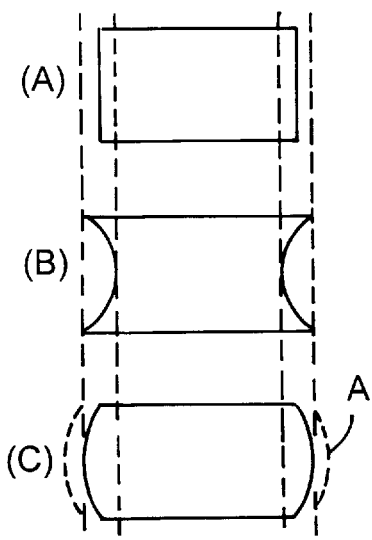
PRIOR ART
FIG. 2
PRIOR ART
FIG. 3

SIDE PINCUSHION CONTROL APPARATUS

BACKGROUND OF THE INVENTION

1. Field of the Invention

The present invention relates to a side pincushion control apparatus for a monitor. More particularly, the present invention relates to a side pincushion control apparatus for a monitor which automatically compensates for a horizontal picture size control voltage and side pincushion for each mode using a microcomputer.

2. Description of the Prior Art

A conventional said pincushion control apparatus is illustrated in FIG. 1. The conventional apparatus is provided with a first variable resistor VR1 for controlling the size of an input parabolic signal, and a first amplifier A1 for inverse-amplifying the parabolic signal provided from the first variable resistor VR1. The conventional apparatus is also provided with a second variable resistor VR2 for controlling the horizontal size of a picture displayed on the monitor, and a second amplifier A2 for inverse-amplifying the parabolic signal provided from the first amplifier A1 and a DC voltage provided from the second variable resistor VR2 to provide its output signal to a side pincushion control section and a horizontal picture size output section.

The reference numerals R1 to R12 represent resistors, and C1 and C2 represent capacitors.

The operation of the conventional side pincushion apparatus as constructed above will be described with reference to FIGS. 1 to 3.

The size of the parabolic signal inputted to the first variable resistor VR1 through the resistor R1 as shown as "A" in FIG. 2 is adjusted by a user's manipulation of the variable resistor VR1, and the size-adjusted parabolic signal is then outputted to an inverting terminal of the first amplifier A1 through the capacitor C1 and the resistor R2. The parabolic signal is inverse-amplified with a predetermined amplification factor by the first amplifier A1, as shown as "B" in FIG. 2.

The parabolic signal inverse-amplified by the first amplifier A1 is applied to an inverting terminal of the second amplifier A2 through the capacitor C2 and the resistor R6. The DC voltage for controlling the horizontal size of the picture on the monitor screen is adjusted by the second variable resistor VR2 and then is applied to the inverting terminal of the second amplifier A2. Specifically, both the inverse-amplified parabolic signal as shown as "C" in FIG. 2 and the DC voltage are inputted to and amplified by the second amplifier A2 with a predetermined amplification factor, as shown as "D" in FIG. 2, and the output signal of the amplifier A2 is applied to the side pincushion control section and the horizontal picture size output section for the side pincushion compensation of the monitor.

The picture state before the side pincushion compensation is shown as "A" in FIG. 3, while the picture state after the side pincushion compensation is shown as "B" and "C" in FIG. 3. The horizontal picture size is temporarily widened as shown as line A in "C" of FIG. 3, and then is restored due to the time constant of the capacitors C1 and C2. Accordingly, the conventional side pincushion apparatus has the drawback that the horizontal picture size temporarily becomes unstable during the side pincushion compensation.

SUMMARY OF THE INVENTION

The present invention has been made to overcome the problems involved in the prior art. It is an object of the present invention to provide a side pin cushion apparatus for a monitor which is capable of compensating for the horizontal picture size control voltage and the amount of side pincushion for each mode using a microcomputer.

In order to achieve the above object, there is provided a side pincushion control apparatus for a monitor having horizontal picture size output means for controlling a horizontal size of a picture according to a horizontal picture size control signal and side pincushion control means for controlling side pincushion of said picture according to a prescribed parabolic signal and a vertical pulse signal, the side pincushion control apparatus comprising:

microcomputer means for providing a digital control signal for controlling the size of said parabolic signal;

digital-to-analog conversion means for converting said digital control signal into an analog signal of a DC voltage;

first amplifying means for inverse-amplifying said parabolic signal by said DC voltage provided from said digital-to-analog conversion means;

clamping means for clamping the maximum voltage of said parabolic signal provided from said first amplifying means within a predetermined voltage level;

second amplifying means for amplifying said horizontal picture size control signal; and third amplifying means for inverse-amplifying said parabolic signal provided from said clamping means and said DC voltage provided from said second amplifying means to provide its output to said side pincushion control means.

BRIEF DESCRIPTION OF THE DRAWINGS

The above object and other advantages of the present invention will become more apparent by describing the preferred embodiment thereof with reference to the accompanying drawings, in which:

FIG. 2 is a waveform diagram illustrating waveforms at various points in FIG. 1 in accordance with the conventional side pincushion control apparatus.

FIG. 3 is a view explaining the side pincushion control operation according to the conventional side pincushion control apparatus.

DETAILED DESCRIPTION OF THE PREFERRED EMBODIMENT

Figure 1:
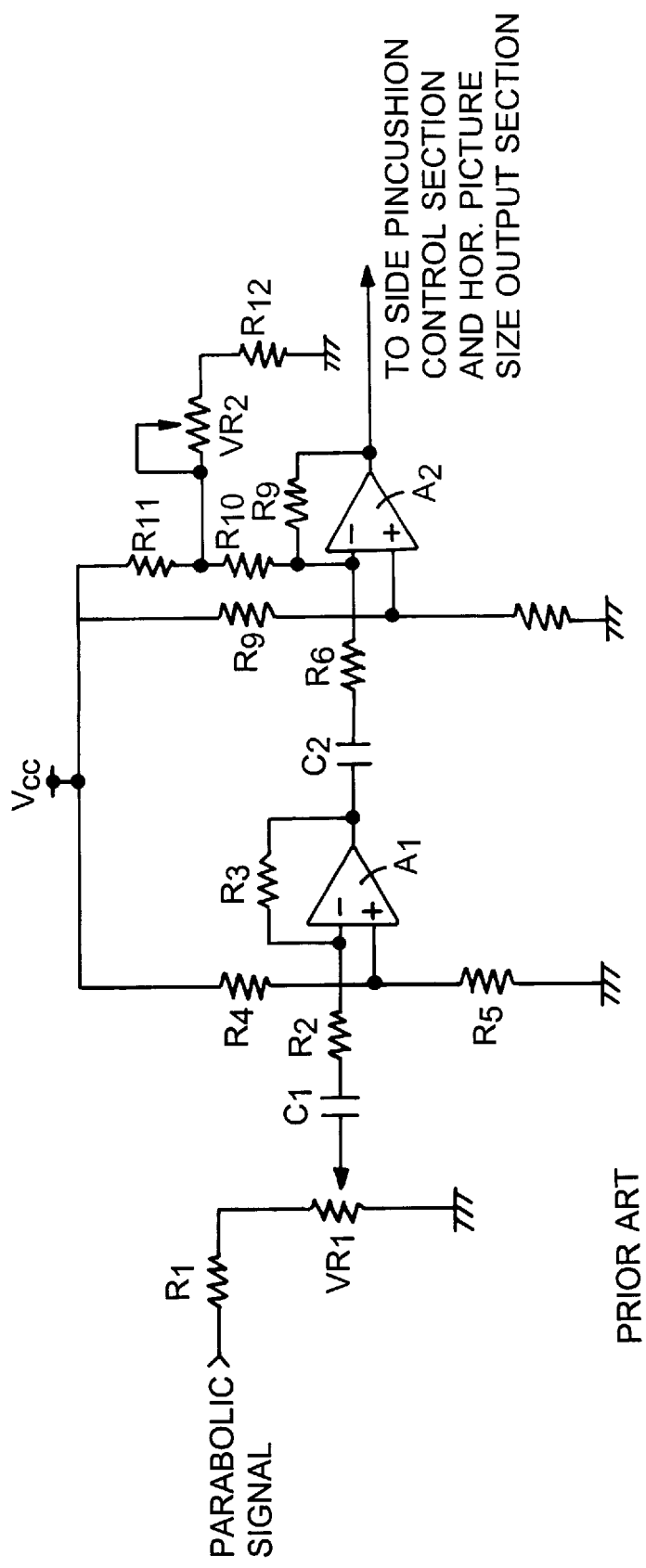
FIG. 1 is a schematic circuit diagram of a conventional side pincushion control apparatus.
Figure 4:
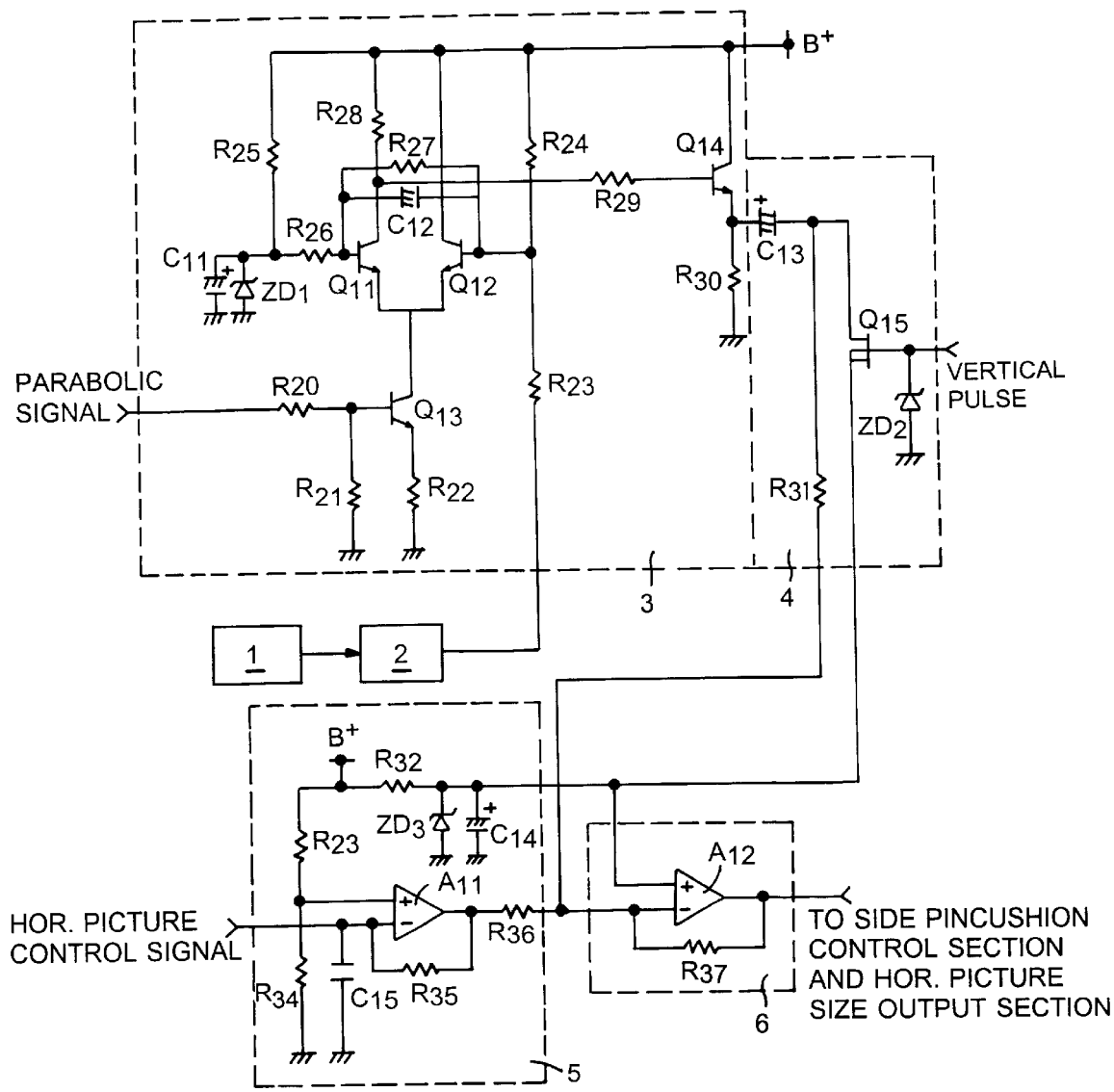
FIG. 4 is a schematic circuit diagram of a side pincushion apparatus according to the present invention.

FIG. 4 shows the side pincushion apparatus according to the present invention.

Referring to FIG. 4, the present apparatus is provided with a microcomputer 1 for providing a digital control signal for controlling the size of a parabolic signal, a digital-to-analog (D/A) converter 2 for converting the digital signal from the microcomputer 1 into an analog signal to provide a predetermined DC voltage for controlling the size of the parabolic signal, and a first amplifying section 3 for inverse-amplifying the DC voltage from the D/A converter 2. The present apparatus is also provided with a clamping section 4 for clamping the maximum voltage of the parabolic signal from the first amplifying section 3 within a predetermined voltage level, a second amplifying section 5 for amplifying an input horizontal picture size control signal, and a third amplifying section 6 for amplifying both the parabolic signal clamped by the clamping section 4 and the horizontal picture size control signal amplified by the second amplifying section 5.

The first amplifying section 3 comprises two transistors Q11 and Q12 which constitute a differential amplifier, and a transistor Q14 for impedance compensation so as to prevent the waveform distortion of the parabolic signal inverse-amplified by the transistor Q11.

The clamping section 4 comprises a capacitor C13 for charging and discharging the parabolic signal inverse-amplified by the first amplifying section 3, and a transistor Q15, which is switching-controlled by an input vertical pulse signal, for clamping the maximum voltage of the parabolic signal provided from the capacitor C13 within a predetermined voltage level to provide the clamped signal to a second amplifier A12 in the third amplifying section 6.

The second amplifying section 5 is composed of a first amplifier A11 for amplifying the DC voltage for controlling the input horizontal picture size to provide the amplified signal to the second amplifier A12 in the third amplifying section 6.

The third amplifying section 6 is composed of the second amplifier A12 for inverse-amplifying the parabolic signal provided from the clamping section 4 and the DC voltage provided from the second amplifying section 5 to provide a control signal for controlling the side pincushion to the following side pincushion control section and horizontal picture size output section (not illustrated).

The reference numerals R20 to R30 represent resistors, C11 to C15 represent capacitors, and ZD1 to ZD3 represent Zonor diodes.

The operation of the side pincushion control apparatus according to the present invention as constructed above will be explained with reference to FIGS. 4 to 6.

The microcomputer 1 outputs to the D/Z converter 2 the digital control signal for controlling the side pincushion of the picture in accordance with the mode variation of the monitor. The D/A converter 2 converts the digital control signal into the analog signal to provide the analog signal to the base of the transistor Q12 in the first amplifying section 3.

Figure 5:
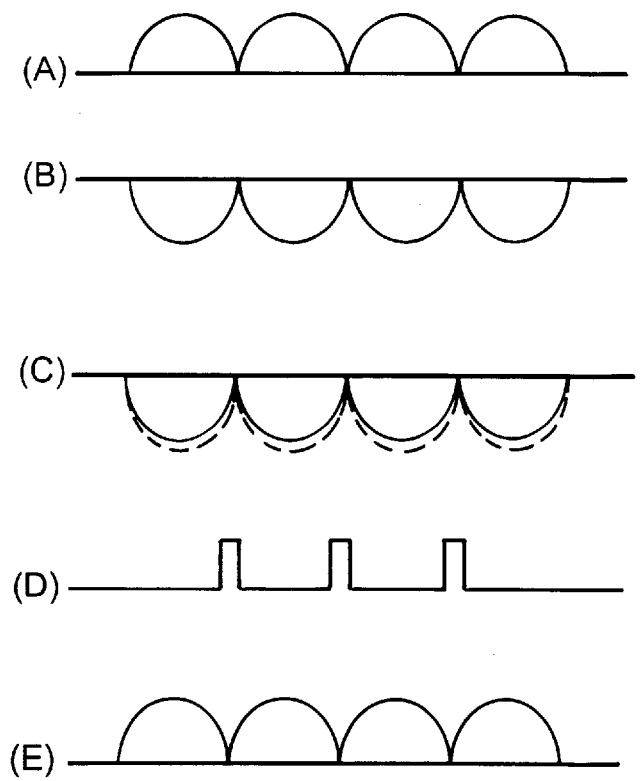
FIG. 5 is waveform diagram illustrating waveforms at various points in FIG. 4 in accordance with the present invention.

At this time, the transistor Q13 in the first amplifying section 3 keeps the current of the parabolic signal as shown as "A" in FIG. 5 constant to provide the parabolic signal of the constant current to the transistor Q11. The transistor Q12 limits the amplifying operation of the transistor Q13 according to the DC voltage provided from the D/A converter 2 through the resistor R23. The transistor Q11 inverse-amplifies the parabolic signal provided from the transistor Q13 as shown in "B" in FIG. 5 according to the control signal provided form the translator Q12, and outputs the amplified signal to the transistor Q14 through the resistor R29. The transistor Q14 matches the impedance of the input parabolic signal so that the parabolic signal is not distorted due to the load variation, and provides the impedance-matched parabolic signal to the capacitor C13 in the clamping section 4.

The transistor Q15 in the clamping section 4 performs switching operation according to the vertical pulse signal which is limited below a predetermined voltage level by the Zenor diode ZD2 as shown as "D" in FIG. 5. Accordingly, the transistor Q15 clamps the maximum voltage of the parabolic signal provided through the capacitor C13 within the predetermined voltage level, and provides the clamped parabolic signal as shown as "C" in FIG. 5 to the inverting terminal of the second amplifier A12 in the third amplifying section 6 through the resistor R31 as well as provides a prescribed voltage to the noninverting terminal of the second amplifier A12 simultaneously.

In the meantime, the prescribed voltage provided from the transistor A15 is limited below a predetermined level through the capacitor C14 and the Zenor diode ZD3, and then is inputted to the noninverting terminal of the first amplifier A11 in the second amplifying section 5. The input horizontal picture size control signal is inputted to the inverting terminal of the first amplifier A11.

The first amplifier A11 amplifies the horizontal picture size control signal and provides the amplified signal to the inverting terminal of the second amplifier A12 in the third amplifying section 6 through the resistor R36, resulting in that the amplified signal is superimposed on the parabolic signal inputted from the clamping section 4.

The second amplifier A12 amplifies the input parabolic signal and the DC voltage as shown as "E" in FIG. 5 to provide the side pincushion control signal to the side pincushion control sction and the horizontal picture size output section.

Figure 6:
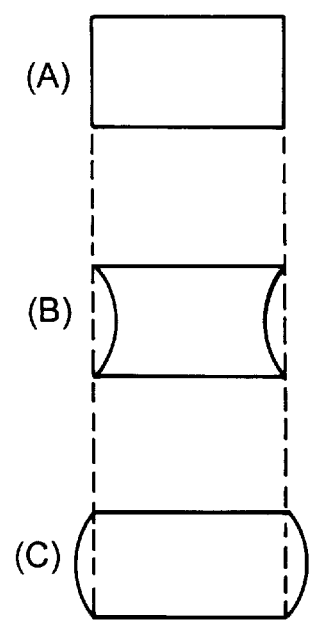
FIG. 6 is a view explaining the side pincushion control operation according to the present invention.

The picture state before the side pincushion compensation is shown as "A" in FIG. 6, while the picture state after the side pincushion compensation according to the control signal provided from the third amplifying section 6 is shown as "B" and "C" in FIG. 6.

From the foregoing, it will be apparent that the present invention provides the advantages that it can stabilize the picture during the side pincushion compensation by automatically compensating for the horizontal picture size control voltages and the amount of side pincushion compensation for each mode using a microcomputer.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A side pincushion control apparatus for a monitor having horizontal picture size output means for controlling a horizontal size of a picture according to a horizontal picture size control signal and side pincushion control means for controlling side pincushion of said picture according to a prescribed parabolic signal and a vertical pulse signal, the said pincushion control apparatus comprising:

microcomputer means for providing a digital control signal for controlling the size of said parabolic signal;

digital-to-analog conversion means for converting said digital control signal into an analog signal of a DC voltage;

first amplifying means for inverse-amplifying said parabolic signal by said DC voltage provided from said digital-to-analog conversion means;

clamping means for clamping the maximum voltage of said parabolic signal provided from said first amplifying means within a predetermined voltage level;

second amplifying means for amplifying said horizontal picture size control signal; and third amplifying means for inverse-amplifying said parabolic signal provided from said clamping means and said DC voltage provided from said second amplifying means to provide its output to said side pincushion control means.

2. A side pincushion control apparatus as claimed in claim 1, wherein said first amplifying means comprises:

a first transistor for keeping the current of said input parabolic signal constant;

a second transistor for determining an amplification factor of said parabolic signal in accordance with said DC voltage provided from said digital-to-analog conversion means;

a third transistor for inverse-amplifying said parabolic signal provided from said first transistor under the control of said second transistor; and a fourth transistor for compensating for the impedance of said parabolic signal inverse-amplified by said third transistor to prevent the waveform distortion of said parabolic signal.

3. A side pincushion control apparatus as claimed in claim 1, wherein said clamping means comprises:

a capacitor for charging and discharging said parabolic signal inverse-amplified by said first amplifying means; and a transistor, which is switching-controlled by an input vertical pulse signal, for clamping the maximum voltage of said parabolic signal provided through said capacitor.

4. A side pincushion control apparatus as claimed in claim 1, wherein said third amplifying means comprises an amplifier for inverse-amplifying said parabolic signal provided from said clamping means and said horizontal picture size control signal provided from said second amplifying means to provide a side pincushion control signal to said side pincushion control means and said horizontal picture size output means.

* * * * *